(12) United States Patent
Zhang et al.

(10) Patent No.: US 11,054,737 B2
(45) Date of Patent: Jul. 6, 2021

(54) MASK, DISPLAY SUBSTRATE AND DISPLAY DEVICE

(71) Applicants: BOE Technology Group Co., Ltd., Beijing (CN); Beijing BOE Display Technology Co., Ltd., Beijing (CN)

(72) Inventors: Xiaoxiang Zhang, Beijing (CN); Huibin Guo, Beijing (CN); Yongzhi Song, Beijing (CN); Mingxuan Liu, Beijing (CN); Wenqing Xu, Beijing (CN); Xiaolong Li, Beijing (CN); Zumou Wu, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 167 days.

(21) Appl. No.: 16/106,155

(22) Filed: Aug. 21, 2018

(65) Prior Publication Data

US 2019/0219917 A1 Jul. 18, 2019

(30) Foreign Application Priority Data

Jan. 17, 2018 (CN) .......................... 201810043420.6

(51) Int. Cl.
  *G03F 1/44* (2012.01)
  *G03F 1/38* (2012.01)
  *G03F 1/58* (2012.01)

(52) U.S. Cl.
  CPC .................. *G03F 1/44* (2013.01); *G03F 1/38* (2013.01); *G03F 1/58* (2013.01)

(58) Field of Classification Search
  CPC .................. G03F 1/44; G03F 1/38; G03F 1/58
  See application file for complete search history.

(56) References Cited

U.S. PATENT DOCUMENTS 5,935,735 A * 8/1999 Okubo ...................... G03F 1/32
                                                                430/5
2005/0111514 A1   5/2005 Matsumoto et al.
(Continued)

FOREIGN PATENT DOCUMENTS

CN          101458449 A       6/2009
CN          101561627 A       10/2009
(Continued)

OTHER PUBLICATIONS

Office Action for corresponding Chinese Application 201810043420.6 dated Sep. 8, 2020.

*Primary Examiner* — Daborah Chacko-Davis
(74) *Attorney, Agent, or Firm* — Arent Fox LLP; Michael Fainberg (57) ABSTRACT

Disclosed are a mask, a display substrate and a display device. The mask comprises a substrate, a first exposure structure, a second exposure structure located at one side of the substrate and disposed opposite to each other, the first exposure structure comprises a first light transmission film layer and a first light shielding film layer, an orthographic projection of the first light shielding film layer falls within an orthographic projection of the first light transmission film layer on the substrate; the second exposure structure comprises a second light transmission film layer and a second light shielding film layer, an orthographic projection of the second light shielding film layer falls within an orthographic projection of the second light transmission film layer on the substrate; a side edge of the first exposure structure has a first zigzag structure, and a side edge of the second exposure structure has a second zigzag structure.

9 Claims, 5 Drawing Sheets

(56) References Cited

U.S. PATENT DOCUMENTS

2015/0079503 A1\* 3/2015 Xie .......................... G03F 1/00
                                                                           430/5
2017/0166862 A1\* 6/2017 Shen ........................ C25D 9/02
2017/0194139 A1    7/2017 Lee et al.

FOREIGN PATENT DOCUMENTS

| CN | 101963753 A | 2/2011 |
|----|-------------|---------|
| CN | 105093813 A | 11/2015 |
| CN | 106054516 A | 10/2016 |

\* cited by examiner

MASK, DISPLAY SUBSTRATE AND DISPLAY DEVICE

CROSS-REFERENCE TO RELATED APPLICATION

This application claims priority of Chinese Patent Application No. 201810043420.6, filed on Jan. 17, 2018, which is hereby incorporated by reference in its entirety.

FIELD

The present disclosure relates to the field of display device fabrication technologies and particularly to a mask, a display substrate and a display device.

BACKGROUND

In the flat panel display devices, the Thin Film Transistor Liquid Crystal Display (TFT-LCD) has the characteristics of small volume, low power consumption, relatively low fabrication cost, no radiation and the like, and plays a dominant role in the current market of flat panel displays.

SUMMARY

An embodiment of the disclosure provides a mask, which includes a substrate, and a first exposure structure and a second exposure structure located at one side of the substrate and disposed opposite to each other, wherein:
 the first exposure structure includes a first light transmission film layer and a first light shielding film layer, where an orthographic projection of the first light shielding film layer on the substrate falls within an orthographic projection of the first light transmission film layer on the substrate;
 the second exposure structure includes a second light transmission film layer and a second light shielding film layer, where an orthographic projection of the second light shielding film layer on the substrate falls within an orthographic projection of the second light transmission film layer on the substrate;
 a side edge of the first exposure structure close to the second exposure structure has a first zigzag structure, and a side edge of the second exposure structure close to the first exposure structure has a second zigzag structure.

Optionally, the first light transmission film layer is located between the first light shielding film layer and the substrate, or the first light shielding film layer is located between the first light transmission film layer and the substrate; and the second light transmission film layer is located between the second light shielding film layer and the substrate, or the second light shielding film layer is located between the second light transmission film layer and the substrate.

Optionally, the first zigzag structure is only formed in the first light transmission film layer, and the second zigzag structure is only formed in the second light transmission film layer.

Optionally, the orthographic projection line of the side edge of the first light shielding film layer close to the second exposure structure on the substrate overlaps with the orthographic projection line of the dedendum line of the first zigzag structure on the substrate, and the orthographic projection line of the side edge of the second light shielding film layer close to the first exposure structure on the substrate overlaps with the orthographic projection line of the dedendum line of the second zigzag structure on the substrate.

Optionally, the orthographic projection line of the side edge of the first light shielding film layer close to the second exposure structure on the substrate is spaced from the orthographic projection line of the dedendum line of the first zigzag structure on the substrate, and the orthographic projection line of the side edge of the second light shielding film layer close to the first exposure structure on the substrate is spaced from the orthographic projection line of the dedendum line of the second zigzag structure on the substrate.

Optionally, the first zigzag structure is formed at the side edges of the first light transmission film layer and the first light shielding film layer close to the second exposure structure, and the second zigzag structure is formed at the side edges of the second light transmission film layer and the second light shielding film layer close to the first exposure structure.

Optionally, the light transmissivity of the first light transmission film layer is 3%~7%, and the light transmissivity of the second light transmission film layer is 3%~7%.

Optionally, the first light transmission film layer includes opaque base materials and nonopaque doped particles, where the opaque base materials include at least two of molybdenum, silicon or chrome, and the nonopaque doped particles include acrylic doped particles, polycarbonate-like material doped particles or polystyrene-like material doped particles; the second light transmission film layer includes opaque base materials and nonopaque doped particles, where the opaque base materials include at least two of molybdenum, silicon or chrome, and the nonopaque doped particles include acrylic doped particles, polycarbonate-like material doped particles or polystyrene-like material doped particles; the first light shielding film layer is a chrome film layer, molybdenum film layer or tungsten film layer; and the second light shielding film layer is a chrome film layer, molybdenum film layer or tungsten film layer.

Optionally, the first zigzag structure includes a plurality of first zigzag units, where a tooth-edge angle of each of the first zigzag units is a sharp angle, or a tooth-edge angle of each of the first zigzag units has a circular chamfer;
 the second zigzag structure includes a plurality of second zigzag units, where a tooth-edge angle of each of the second zigzag units is a sharp angle, or a tooth-edge angle of each of the second zigzag units has a circular chamfer.

Optionally, the tooth-edge angle of each of the first zigzag units is 30°~60°; and the tooth-edge angle of each of the second zigzag units is 30°~60°.

Optionally, the spacing between the addendum line of the first zigzag structure and the addendum line of the second zigzag structure is 1.8 mm~2.2 mm.

An embodiment of the disclosure further provides a display substrate which is formed by the mask of any one of the above technical solutions.

An embodiment of the disclosure further provides a display device which includes the display substrate described above.

DETAILED DESCRIPTION OF THE EMBODIMENTS

Figure 1:
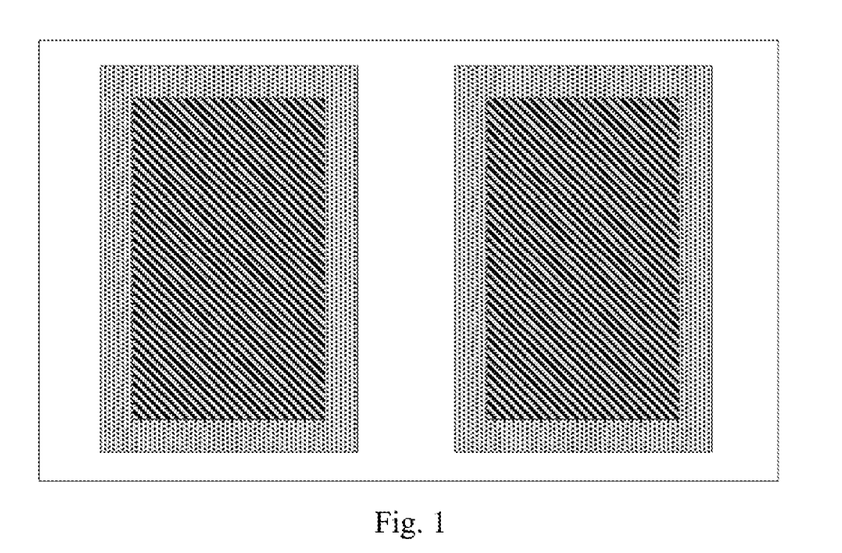
FIG. 1 is a structural schematic diagram of the mask in the related art.

In the fabrication process of the TFT-LCD, the Phase Shift Mask (PSM, for short) as shown in FIG. 1 is generally used to perform the exposure processing on the TFT, to decrease the spacings among all the metal wires and thus increase the number of the pixel units, to thereby obtain the TFT-LCD with the higher resolution.

The resolution of the TFT-LCD is increased only in the limited range when the PSM in the related art is used to perform the exposure, and the PSM is not applicable any more when the demand on the resolution of the TFT-LCD is higher.

In order to increase the resolution of the display device and thus increase the display quality of the display device, the embodiments of the disclosure provide a mask, a display substrate and a display device. In order to make the objects, technical solutions and advantages clearer, the disclosure will be illustrated below in details with reference to the embodiments.

As shown in FIGS. 2 to 10, the embodiments of the disclosure provide a mask, which includes a substrate 1, and a first exposure structure 2 and a second exposure structure 3 located at one side of the substrate 1 and disposed opposite to each other, wherein:

the first exposure structure 2 includes a first light transmission film layer 4 and a first light shielding film layer 5, where the orthographic projection of the first light shielding film layer 5 on the substrate 1 falls within the orthographic projection of the first light transmission film layer 4 on the substrate 1;

the second exposure structure 3 includes a second light transmission film layer 6 and a second light shielding film layer 7, where the orthographic projection of the second light shielding film layer 7 on the substrate 1 falls within the orthographic projection of the second light transmission film layer 6 on the substrate 1;

the side edge of the first exposure structure 2 close to the second exposure structure 3 has a first zigzag structure 8, and the side edge of the second exposure structure 3 close to the first exposure structure 2 has a second zigzag structure 9.

With the mask in this technical solution, since the side edges close to each other of the first exposure structure and the second exposure structure are provided with the zigzag structures respectively, when the mask is used to perform the exposure on the display substrate and other means requiring to be exposed, the interference and diffraction effects of the light among the zigzag structures can be enhanced, so that the light is relatively centralized to increase the light intensity of the transmission light, which can meet the smaller-size exposure demand, and thus can increase the resolution of the display device formed by the mask and increase the display quality of the display device.

In an optional embodiment of the disclosure, the relative position relationship of the first light transmission film layer and the first light shielding film layer is not limited, and the relative position relationship of the second light transmission film layer and the second light shielding film layer is not limited. Optionally, as shown in FIGS. 2 to 10, the first light transmission film layer 4 is located between the first light shielding film layer 5 and the substrate 1, and the second light transmission film layer 6 is located between the second light shielding film layer 7 and the substrate 1. In another optional embodiment of the disclosure, the first light shielding film layer can also be located between the first light transmission film layer and the substrate, and the second light shielding film layer can also be located between the second light transmission film layer and the substrate.

As shown in FIGS. 2 to 7, in an optional embodiment of the disclosure, the first zigzag structure 8 is only formed in the first light transmission film layer 4, and the second zigzag structure 9 is only formed in the second light transmission film layer 6, while the side edge of the first light shielding film layer close to the second exposure structure presents a straight line, and the side edge of the second light shielding film layer close to the first exposure structure presents a straight line.

Figure 2:
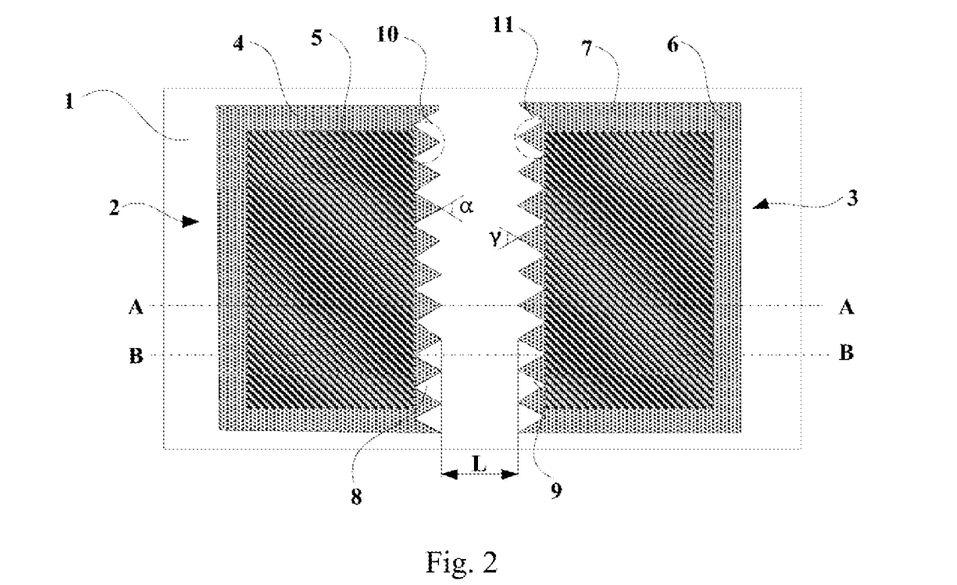
FIG. 2 is a structural schematic diagram of a mask of an embodiment of the disclosure.
Figure 3:
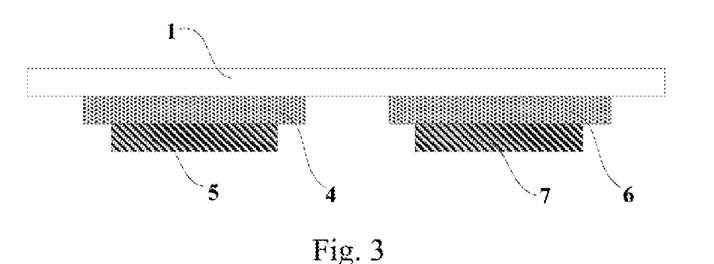
FIG. 3 is a schematic diagram of the cross section at A-A in FIG. 2.
Figure 4:
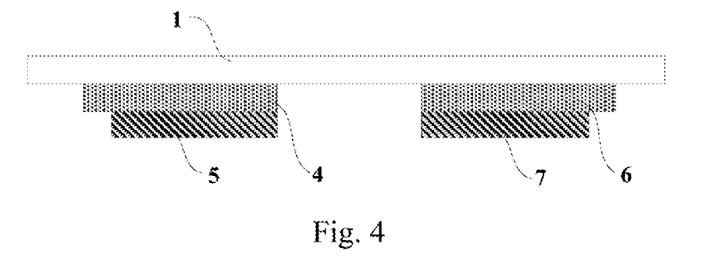
FIG. 4 is a schematic diagram of the cross section at B-B in FIG. 2.

Here, as shown in FIGS. 2 to 4, the orthographic projection line of the side edge of the first light shielding film layer 5 close to the second exposure structure 3 on the substrate overlaps with the orthographic projection line of the dedendum line of the first zigzag structure 8 on the substrate, and the orthographic projection line of the side edge of the second light shielding film layer 7 close to the first exposure structure 2 on the substrate overlaps with the orthographic projection line of the dedendum line of the second zigzag structure 9 on the substrate.

Figure 5:
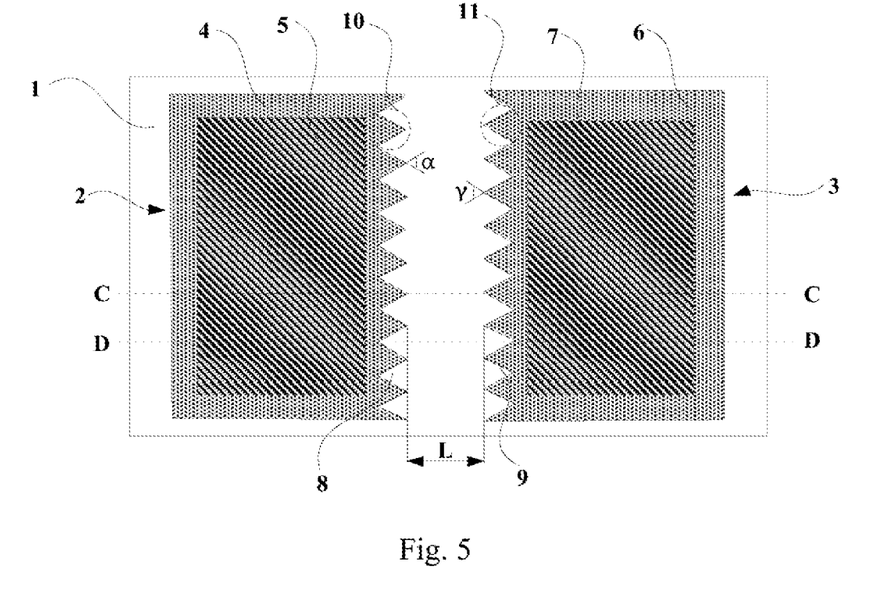
FIG. 5 is a structural schematic diagram of a mask of another embodiment of the disclosure.
Figure 6:
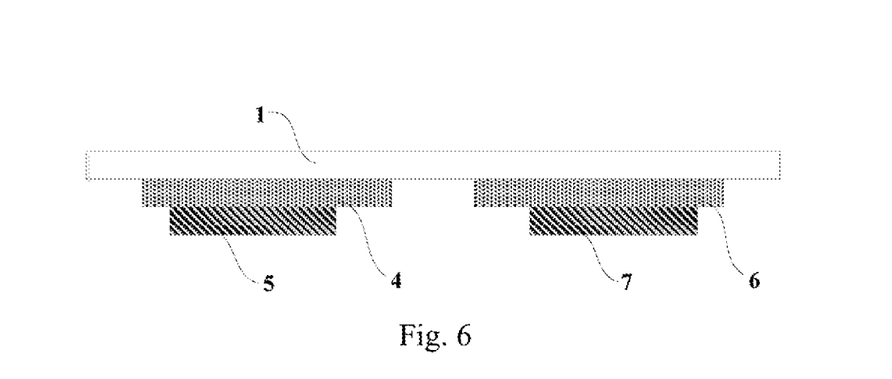
FIG. 6 is a schematic diagram of the cross section at C-C in FIG. 5.
Figure 7:
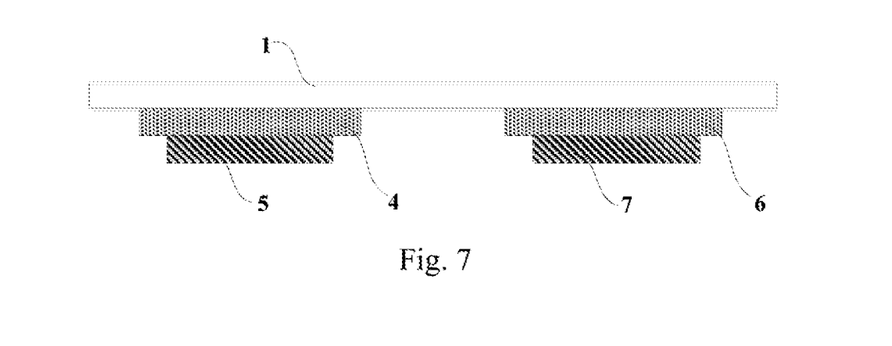
FIG. 7 is a schematic diagram of the cross section at D-D in FIG. 5.

As shown in FIGS. 5 to 7, the orthographic projection line of the side edge of the first light shielding film layer 5 close to the second exposure structure 3 on the substrate is spaced from the orthographic projection line of the dedendum line of the first zigzag structure 8 on the substrate, and the orthographic projection line of the side edge of the second light shielding film layer 7 close to the first exposure structure 2 on the substrate is spaced from the orthographic projection line of the dedendum line of the second zigzag structure 9 on the substrate.

Figure 8:
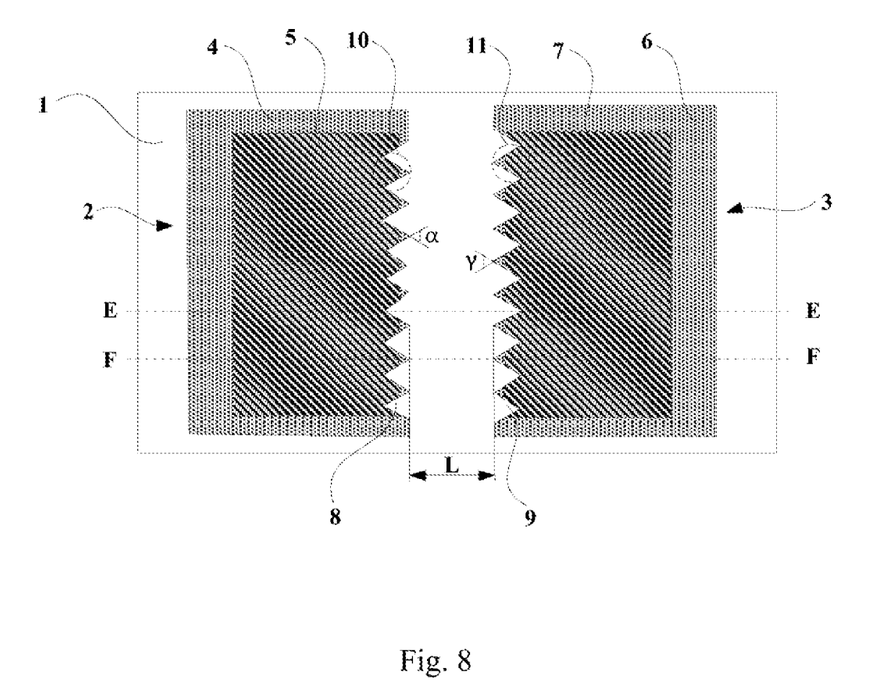
FIG. 8 is a structural schematic diagram of a mask of yet another embodiment of the disclosure.
Figure 9:
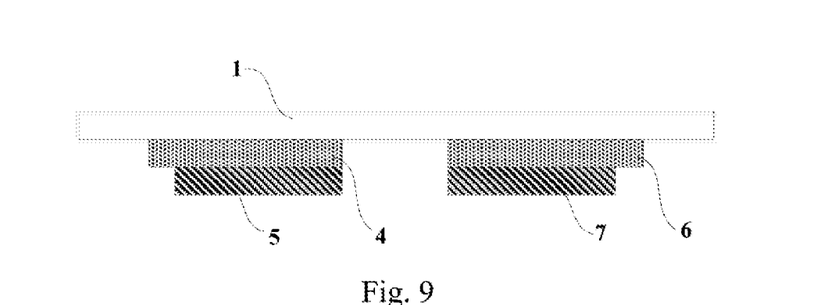
FIG. 9 is a schematic diagram of the cross section at E-E in FIG. 8.
Figure 10:
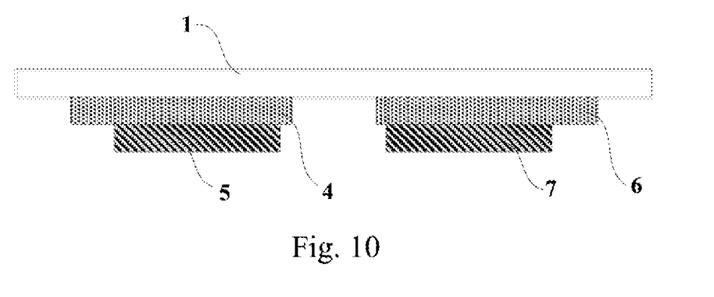
FIG. 10 is a schematic diagram of the cross section at F-F in FIG. 8.

As shown in FIGS. 8 to 10, in another optional embodiment of the disclosure, the first zigzag structure 8 is formed at the side edges of the first light transmission film layer 4 and the first light shielding film layer 5 close to the second exposure structure 3, and the second zigzag structure 9 is formed at the side edges of the second light transmission film layer 6 and the second light shielding film layer 7 close to the first exposure structure 2.

In an optional embodiment of the disclosure, the light transmissivity of the first light transmission film layer is 3%~7%, and the light transmissivity of the second light transmission film layer is 3%~7%. The light transmissivities of the first and second light transmission film layers are set in such a range that the light intensity of the transmission light can be increased in a certain range while the interference and diffraction effects of the light are not weakened.

The materials of the first light transmission film layer, the second light transmission film layer, the first light shielding film layer and the second light shielding film layer are not limited. In an optional embodiment of the disclosure, the first light transmission film layer includes opaque base materials and nonopaque doped particles, where the opaque base materials can include at least two of molybdenum, silicon or chrome, and the nonopaque doped particles can include acrylic doped particles, polycarbonate-like material doped particles or polystyrene-like material doped particles or the like; and similarly, the second light transmission film layer includes opaque base materials and nonopaque doped particles, where the opaque base materials can include at least two of molybdenum, silicon or chrome, and the nonopaque doped particles can include acrylic doped particles, polycarbonate-like material doped particles or polystyrene-like material doped particles or the like. The first light shielding film layer can be a chrome film layer, molybdenum film layer or tungsten film layer; and the second light shielding film layer can be a chrome film layer, molybdenum film layer or tungsten film layer.

As shown in FIGS. 2 to 10, in an optional embodiment of the disclosure, the first zigzag structure 8 includes a plurality of first zigzag units 10, where the tooth-edge angle α of each first zigzag unit 10 can be a sharp angle; and the second zigzag structure 9 includes a plurality of second zigzag units 11, where the tooth-edge angle γ of each second zigzag unit 11 can be a sharp angle.

In another optional embodiment of the disclosure, the tooth-edge angle of each first zigzag units can also have a circular chamfer; and the tooth-edge angle of each second zigzag units can also have a circular chamfer.

As shown in FIGS. 2, 5 and 8, in an optional embodiment of the disclosure, the tooth-edge angle α of each first zigzag unit 10 is 30°~60°; and the tooth-edge angle γ of each second zigzag unit is 30°~60°. Thus the interference and diffraction effects of the light among the zigzag structures can be enhanced more effectively, so that the light is relatively centralized.

In an optional embodiment of the disclosure, the spacing between the addendum line of the first zigzag structure and the addendum line of the second zigzag structure is 1.8 mm~2.2 mm. By setting the spacing between the first zigzag structure and the second zigzag structure in this range, the interference and diffraction effects of the light can be more obvious, so that the light is relatively centralized to increase the light intensity of the transmission light.

An embodiment of the disclosure further provides a display substrate which is formed by the mask of any one of the above technical solutions.

In the case that the display substrate is formed by the mask of any one of the above technical solutions, since the side edges close to each other of the first exposure structure and the second exposure structure are provided with the zigzag structures respectively, when the mask is used to perform the exposure on the display substrate, the interference and diffraction effects of the light among the zigzag structures can be enhanced, so that the light is relatively centralized to increase the light intensity of the transmission light, which can meet the demand of the display substrate on some smaller-size exposure, e.g., decrease the spacings among all the metal wires, and thus increase the number of the pixels on the display substrate, to thereby increase the resolution of the display device including this display substrate, increase the display quality of the display device and further implement the narrow border design of the display device.

An embodiment of the disclosure further provides a display device which includes the display substrate of the above-mentioned technical solution.

The display device of the embodiment of the disclosure has the higher resolution and better display effect.

The type of the display device is not limited, and can be a liquid crystal panel, an electronic paper, an OLED panel, a liquid crystal television, a liquid crystal display, a mobile phone, a tablet computer or the like.

Evidently those skilled in the art can make various modifications and variations to the disclosure without departing from the spirit and scope of the disclosure. Thus the disclosure is also intended to encompass these modifications and variations therein as long as these modifications and variations come into the scope of the claims of the disclosure and their equivalents.

What is claimed is:

1. A mask, comprises a substrate, and a first exposure structure and a second exposure structure located at one side of the substrate and disposed opposite to each other, wherein:

the first exposure structure comprises a first light transmission film layer and a first light shielding film layer, where an orthographic projection of the first light shielding film layer on the substrate falls within an orthographic projection of the first light transmission film layer on the substrate;

the second exposure structure comprises a second light transmission film layer and a second light shielding film layer, where an orthographic projection of the second light shielding film layer on the substrate falls within an orthographic projection of the second light transmission film layer on the substrate;

a side edge of the first exposure structure close to the second exposure structure has a first zigzag structure, and a side edge of the second exposure structure close to the first exposure structure has a second zigzag structure;

wherein the first zigzag structure is only formed in the first light transmission film layer, and the second zigzag structure is only formed in the second light transmission film layer.

2. The mask of claim 1, wherein the first light transmission film layer is located between the first light shielding film layer and the substrate, or the first light shielding film layer is located between the first light transmission film layer and the substrate;

the second light transmission film layer is located between the second light shielding film layer and the substrate, or the second light shielding film layer is located between the second light transmission film layer and the substrate.

3. The mask of claim 1, wherein an orthographic projection line of a side edge of the first light shielding film layer close to the second exposure structure on the substrate overlaps with an orthographic projection line of a dedendum line of the first zigzag structure on the substrate, and an orthographic projection line of a side edge of the second light shielding film layer close to the first exposure structure on the substrate overlaps with an orthographic projection line of a dedendum line of the second zigzag structure on the substrate.

4. The mask of claim 1, wherein an orthographic projection line of a side edge of the first light shielding film layer close to the second exposure structure on the substrate is spaced from an orthographic projection line of a dedendum line of the first zigzag structure on the substrate, and an orthographic projection line of a side edge of the second light shielding film layer close to the first exposure structure on the substrate is spaced from an orthographic projection line of a dedendum line of the second zigzag structure on the substrate.

5. The mask of claim 1, wherein a light transmissivity of the first light transmission film layer is 3%~7%, and a light transmissivity of the second light transmission film layer is 3%~7%.

6. The mask of claim 1, wherein
the first light transmission film layer comprises opaque base materials and nonopaque doped particles, where the opaque base materials comprise at least two of molybdenum, silicon or chrome, and the nonopaque doped particles comprise acrylic doped particles, polycarbonate-like material doped particles or polystyrene-like material doped particles;
the second light transmission film layer comprises opaque base materials and nonopaque doped particles, where the opaque base materials comprise at least two of molybdenum, silicon or chrome, and the nonopaque doped particles comprise acrylic doped particles, polycarbonate-like material doped particles or polystyrene-like material doped particles;
the first light shielding film layer is a chrome film layer, molybdenum film layer or tungsten film layer;
the second light shielding film layer is a chrome film layer, molybdenum film layer or tungsten film layer.

7. The mask of claim 1, wherein the first zigzag structure comprises a plurality of first zigzag units, where a tooth-edge angle of each of the first zigzag units is a sharp angle; or a tooth-edge angle of each of the first zigzag units has a circular chamfer;
the second zigzag structure comprises a plurality of second zigzag units, where a tooth-edge angle of each of the second zigzag units is a sharp angle; or a tooth-edge angle of each of the second zigzag units has a circular chamfer.

8. The mask of claim 7, wherein the tooth-edge angle of each of the first zigzag units is 30°~60°; and the tooth-edge angle of each of the second zigzag units is 30°~60°.

9. The mask of claim 1, wherein a spacing between an addendum line of the first zigzag structure and an addendum line of the second zigzag structure is 1.8 mm~2.2 mm.

* * * * *

UNITED STATES PATENT AND TRADEMARK OFFICE
CERTIFICATE OF CORRECTION

PATENT NO. : 11,054,737 B2  
APPLICATION NO. : 16/106155  
DATED : July 6, 2021  
INVENTOR(S) : Xiaoxiang Zhang et al.

Page 1 of 1

It is certified that error appears in the above-identified patent and that said Letters Patent is hereby corrected as shown below:

On the Title Page (71) The Applicants read:
"BOE Technology Group Co., Ltd., Beijing (CN); Beijing BOE Display Technology Co., Ltd., Beijing (CN)"

Should read:
-- Beijing BOE Display Technology Co., Ltd., Beijing (CN); BOE Technology Group Co., Ltd., Beijing (CN) --

Signed and Sealed this  
Seventeenth Day of January, 2023

Katherine Kelly Vidal  
*Director of the United States Patent and Trademark Office*